United States Patent
Ido et al.

(10) Patent No.: US 7,098,709 B2
(45) Date of Patent: Aug. 29, 2006

(54) SPREAD-SPECTRUM CLOCK GENERATOR

(75) Inventors: Takaaki Ido, Komaki (JP); Koji Okada, Kasugai (JP); Tomonobu Miyata, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/866,985

(22) Filed: Jun. 15, 2004

(65) Prior Publication Data

US 2005/0122145 A1   Jun. 9, 2005

(30) Foreign Application Priority Data

Dec. 4, 2003 (JP) .............................. 2003-405873

(51) Int. Cl.
*H03L 7/06* (2006.01)
(52) U.S. Cl. .................. 327/156; 327/145; 327/113
(58) Field of Classification Search ................ 327/105, 327/113, 114, 141, 144–148, 154–158, 162, 327/163
See application file for complete search history.

(56) References Cited

U.S. PATENT DOCUMENTS

| | | | | |
|---|---|---|---|---|
| 5,534,823 A | * | 7/1996 | Kondou | 331/16 |
| 5,610,955 A | * | 3/1997 | Bland | 375/376 |
| 5,631,920 A | * | 5/1997 | Hardin | 375/130 |
| 5,651,035 A | * | 7/1997 | Tozun et al. | 375/373 |
| 5,659,587 A | * | 8/1997 | Knierim | 375/376 |
| 6,294,936 B1 | * | 9/2001 | Clementi | 327/156 |
| 6,501,307 B1 | * | 12/2002 | Yen | 327/113 |
| 6,798,302 B1 | * | 9/2004 | Starr et al. | 331/78 |

FOREIGN PATENT DOCUMENTS

JP          2000-101424        4/2000

* cited by examiner

*Primary Examiner*—Terry D. Cunningham
*Assistant Examiner*—Hai L. Nguyen
(74) *Attorney, Agent, or Firm*—Arent Fox PLLC

(57) ABSTRACT

This invention provides a clock generator which is capable of improving modulation accuracy without accompanying an increase in consumption current by steady current when spectrum spread of a clock signal is executed. The phase balanced voltage Vf to be inputted to the voltage control oscillator (VCO) 9 is modulated within a dead band region in which no difference signals Pr, Pr are outputted from the charge pump circuit 7 when a difference in oscillation frequency between an output clock signal fo and a reference clock signal fr is detected. Consequently, the output clock signal fo is changed within the range of a lock frequency in a PLL circuit, so as to execute the spectrum spread of the output clock signal fo while maintaining the lock state of the oscillation frequency in the PLL circuit.

16 Claims, 14 Drawing Sheets

MODULATOR CIRCUIT 11B DIRECTED TO FIRST EMBODIMENT

MODULATION CONTROL CIRCUIT FOR CONTROLLING MODULATOR CIRCUITS 11A AND 11B

FIG. 1 CIRCUIT BLOCK DIAGRAM FOR ILLUSTRATING PRINCIPLE OF PRESENT INVENTION

MODULATOR CIRCUIT 11A DIRECTED TO FIRST EMBODIMENT

MODULATOR CIRCUIT 11B DIRECTED TO FIRST EMBODIMENT

FIG. 4  MODULATION CONTROL CIRCUIT FOR CONTROLLING MODULATOR CIRCUITS 11A AND 11B

MODULATOR CIRCUIT 12A DIRECTED TO SECOND EMBODIMENT

MODULATOR CIRCUIT 12B DIRECTED TO SECOND EMBODIMENT

MODULATION CONTROL CIRCUIT FOR CONTROLLING MODULATOR CIRCUITS 12A AND 12B

TIMING CHART FOR SHOWING MODULATION OPERATION BY MODULATION CONTROL CIRCUIT OF FIG. 8

MODULATOR CIRCUIT 13B DIRECTED TO THIRD EMBODIMENT

MODULATION CONTROL CIRCUIT DIRECTED TO FOURTH EMBODIMENT
IN WHICH UP/DOWN COUNTER IS USED

MODULATION CONTROL CIRCUIT DIRECTED TO
FOURTH EMBODIMENT IN WHICH ROM IS USED

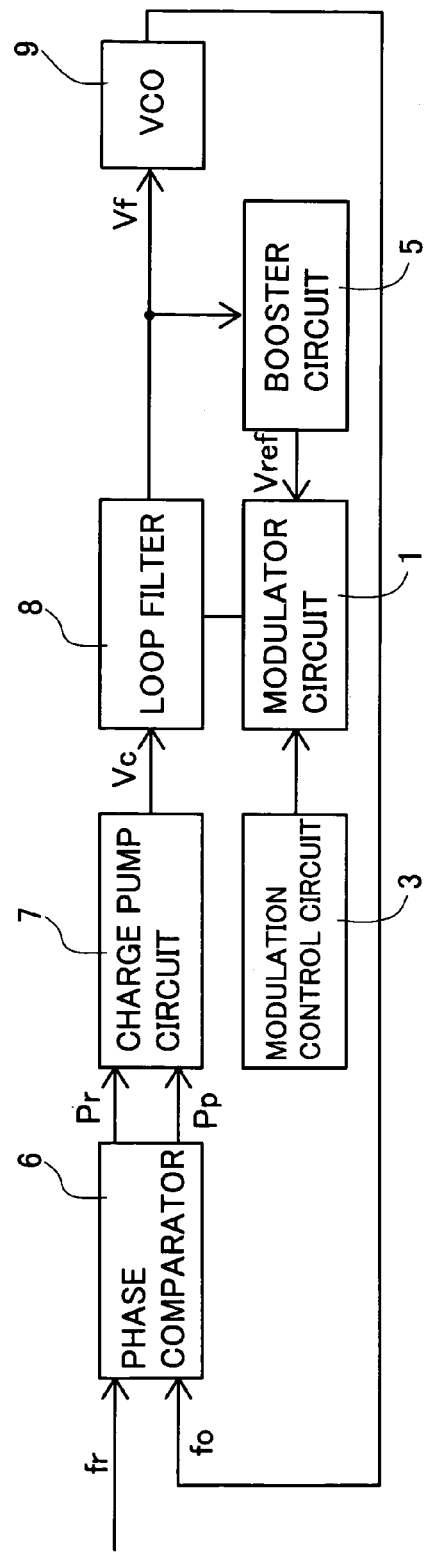
FIG. 14 CIRCUIT BLOCK DIAGRAM DIRECTED TO FIFTH EMBODIMENT IN WHICH BOOSTER CIRCUIT FOR GENERATING PREDETERMINED VOLTAGE IS EMPLOYED

SPREAD-SPECTRUM CLOCK GENERATOR

CROSS-REFERENCE TO RELATED APPLICATIONS

This application is based upon and claims the benefit of priority from each of the prior Japanese Patent Application No. 2003-405873 filed on Dec. 4, 2003, the entire contents of which are incorporated herein by reference.

BACKGROUND OF THE INVENTION

1. Field of the Invention

The present invention relates to a clock generator which generates a clock signal of which oscillation frequency is diffused with spectrum to reduce electromagnetic wave radiation due to high-speed oscillation operation.

2. Description of Related Art

As higher performance in electric appliances has conventionally been advanced, operation of appliance has been sped up further more and higher integration design of semiconductor devices for those appliances and theirs packaging substrates has been developed. An oscillation period of a clock signal and the like is shortened to meet with the level same as wiring length of signal wirings on a packaging substrates and its semiconductor device, which results in that signal wiring functions as an antenna and electromagnetic wave radiation, unnecessary radiation, increases.

Furthermore, portable electric appliances have become popular for recent years and suppression of electromagnetic waves radiation is demanded for those portable electric appliances. Since miniaturization and weight saving are required for portable electric appliances, conventional countermeasure such as improvement of circuit arrangement design, insertion of shielding material against electromagnetic wave and the like are restricted before such necessity.

As countermeasure, there has been suggested so-called spectrum diffusion technology for changing oscillation frequency of a clock signal. As an example for such case that a clock signal to which spectrum diffusion is applied is outputted in a PLL circuit, JP Laid-open Patent publication No. 2000-101424 discloses related technology.

First technology is such that an integrated clock signal is obtained by integrating a to-be-inputted clock signal with an integrator, and in a limiter, an integrated clock signal is modulated by a frequency control signal of which voltage level changes with frequency lower than that of a clock signal, whereby there is obtained an output clock signal of which cycle continuously changes. To be more specific, voltage level of an integrated clock signal and that of a frequency control signal are compared, whereby cycle of an integrated clock signal is modulated with changed frequency responsive to voltage level of a frequency control signal and an output clock is obtained. Oscillation frequency is changed by inputting an output clock signal of which frequency changes to a PLL circuit.

Second technology is such that there is provided a direct current amplifier between a low pass filter (LPF) and a voltage control oscillator (VCO) and a frequency control signal of which voltage level changes is inputted to the direct current amplifier.

Third technology is such that, in a charge pump, bias current which generates in response to a frequency control signal is added to charge current which generates in response to an output signal from a phase comparator and voltage level of a capacitor charged/discharged depending on current is controlled, whereby voltage level of a control signal to be inputted to a voltage control oscillator (VCO) is controlled so as to control oscillation frequency.

SUMMARY OF THE INVENTION

Any technology disclosed in JP Laid-open Patent Publication No. 2000-101424 accompany increase power consumption at a clock generator circuit, which is problematic.

That is, the first technology requires an integrator and a limiter in addition to a typical clock generator circuit. An operational amplifier may be required as composing element of an integrator and a comparator may be required as composing element of a limiter. An operational amplifier and a comparator require bias current flowing constantly in terms of circuit structure and this causes increase of power consumption.

The second technology requires a direct current amplifier so as to modulate voltage level to be inputted to a voltage control oscillator (VCO). A direct current amplifier also requires bias current flowing constantly, which results in increase of power consumption.

The third technology requires bias current depending on a frequency control signal in addition to charge current which generates in response to an output signal from a phase comparator so as to modulate voltage level to be inputted to a voltage control oscillator (VCO). This case also causes increase of power consumption due to bias current.

It may be required that a modulated frequency band and modulation cycle of a clock signal to which spectrum diffusion is applied should be controlled with high accuracy so as to efficiently reduce electromagnetic wave radiate. For that purpose, it is required to control voltage level of a signal to be inputted to a voltage control oscillator (VCO) with high accuracy. Conventionally, control has been made taking following steps: voltage level outputted from a low pass filter is converted from analog to digital; digital operation is conducted to obtain modulated level with high accuracy; and the modulated level is converted from digital to analog and inputted to a voltage control oscillator. An AD converter and a DA converter require bias current flowing constantly in terms of circuit structure. Power consumption increases for the purpose of modulation accuracy improvement, which is problematic.

The present invention has been made to resolve at least one of the above-mentioned problems. The present invention intends to provide a clock generator of which modulation accuracy improvement can be achieved without accompanying increase of power consumption due to constant current when spectrum diffusion is applied to a clock signal.

To achieve the object, according to one aspect of the present invention, there is provided a clock generator comprising: a charge pump for inputting/outputting charges depending on oscillation frequency difference of a reference clock signal and an output clock signal; a loop filter including a first capacitance section which charges/discharges charge inputted/outputted from the charge pump, the loop filter outputting smoothed phase balanced voltage; and an oscillator section for outputting an output clock signal of which oscillation frequency depends on the phase balanced voltage, wherein the clock generator further comprises a modulator circuit for modulating the phase balanced voltage within a dead band region of the charge pump by changing a capacitance value of the loop filter including the first capacitance section.

In the clock generator directed to the one aspect of the present invention, the modulator circuit modulates phase balanced voltage so that oscillation frequency of an output clock should be modulated within a range of frequency difference which corresponds to a dead band region of the charge pump. Modulation of phase balanced voltage is made by modulating a capacitance value of the loop filter including the first capacitance section for charges charged/discharged from there.

Phase balanced voltage is modulated within an range where input/output of charges by the charge pump is not conducted by positively using a dead band region in the charge pump so that oscillation frequency of an output clock signal can be modulated including oscillation frequency of a reference clock signal.

The above and further objects and novel features of the invention will more fully appear from the following detailed description when the same is read in connection with the accompanying drawings. It is to be expressly understood, however, that the drawings are for the purpose of illustration only and are not intended as a definition of the limits of the invention.

BRIEF DESCRIPTION OF THE DRAWINGS

FIG. 14 is a circuit block diagram directed to fifth embodiment in which a booster circuit for generating predetermined voltage is employed.

DETAILED DESCRIPTION OF THE PREFERRED EMBODIMENTS

Hereinafter, the preferred embodiment of the clock generator of the present invention will be described in detail with reference to FIGS. 1–14.

Figure 1:
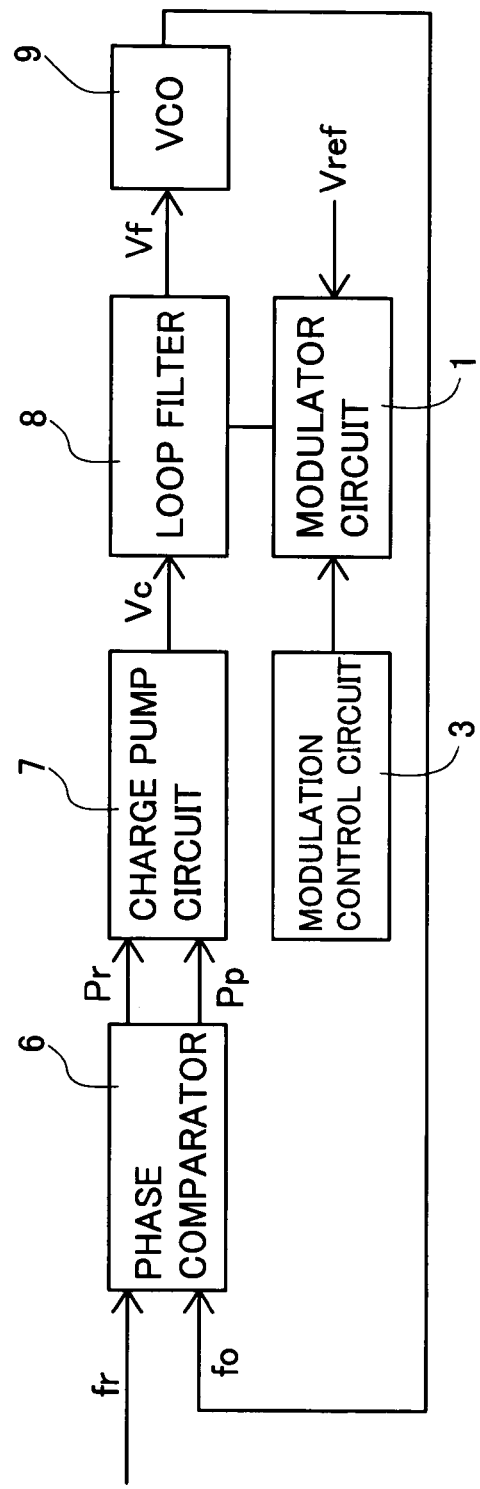
FIG. 1 is a circuit block diagram for illustrating the principle of the present invention.

FIG. 1 is a circuit block diagram showing the principle of the clock generator of the present invention. Its basic circuit section for outputting an output clock signal fo is constructed of a well known PLL circuit. More specifically, a reference clock signal fr and an output clock signal fo outputted from a voltage control oscillator (VCO) 9 are inputted to a phase comparator 6 and a difference signals Pr, PP corresponding to a difference in oscillation frequency are outputted. These difference signals Pr, Pr are inputted to a charge pump circuit 7 and an output signal Vc is outputted. Pulse-like charges are inputted/outputted into/from the charge pump circuit 7 and then, a pulse-like voltage signal is outputted as an output signal Vc. A loop filter (LPF) 8 smoothes the output signal Vc to output a phase balanced voltage Vf to a voltage control oscillator (VCO) 9. The voltage control oscillator (VCO) 9 outputs the output clock signal fo which oscillates under a frequency corresponding to the phase balanced voltage Vf.

If the oscillation frequency of the output clock signal fo meets the oscillation frequency of the reference clock signal fr, no difference signals Pr, Pp are outputted. Because at this time, there exists a dead band region in which no difference signals Pr, Pp are outputted to the charge pump circuit 7 even if there is a difference in oscillation frequency originated from mainly a delay in response of the phase comparator 6, the output clock signal fo is locked within a predetermined frequency range containing the same oscillation frequency as the reference clock signal fr.

According to the present invention, spread spectrum of the output clock signal fo is carried out with lock condition of the oscillation frequency in the PLL circuit maintained by changing the output clock signal fo within this dead band region.

A modulator circuit 1 is connected to a loop filter (LPF) 8. The phase balanced voltage Vf to be inputted to the voltage control oscillator (VCO) 9 is modulated so that the output clock signal fo changes within the range of the dead band region. This is a circuit in which the phase balanced voltage Vf outputted from the loop filter (LPF) 8 locked by the PLL circuit is modulated based on the predetermined voltage Vref. Because the voltage deflection width of the phase balanced voltage Vf is adjusted by the modulation control circuit 3 corresponding to a passage of time, the phase balanced voltage Vf is modulated into a predetermined waveform, so that the output clock signal fo is changed within the range of a lock frequency in the PLL circuit.

Hereinafter, the embodiment of the modulator circuit 1, the modulation control circuit 3 and the predetermined voltage Vref will be described below.

Figure 2:
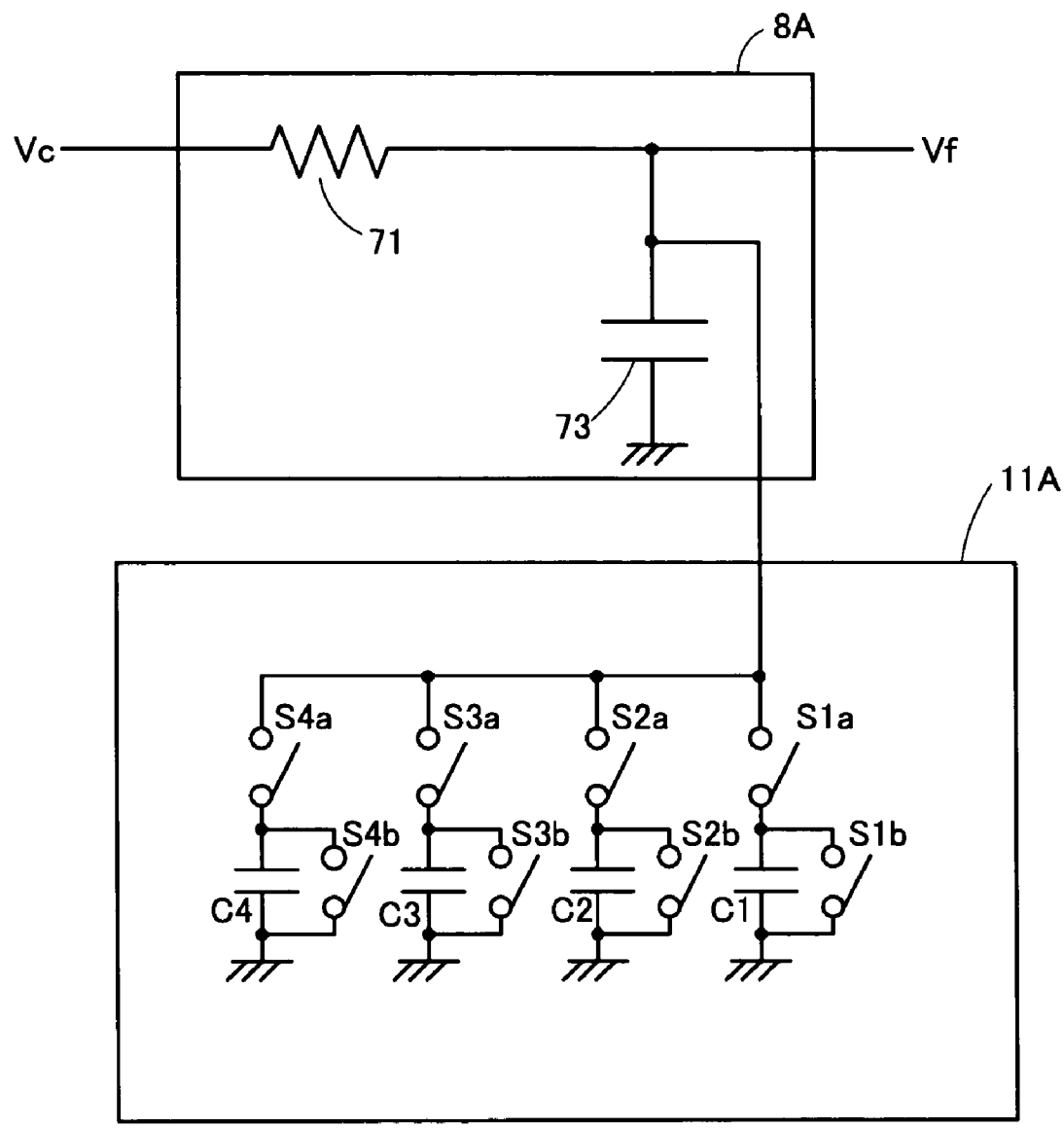
FIG. 2 shows a modulator circuit 11A directed to a first embodiment.
Figure 3:
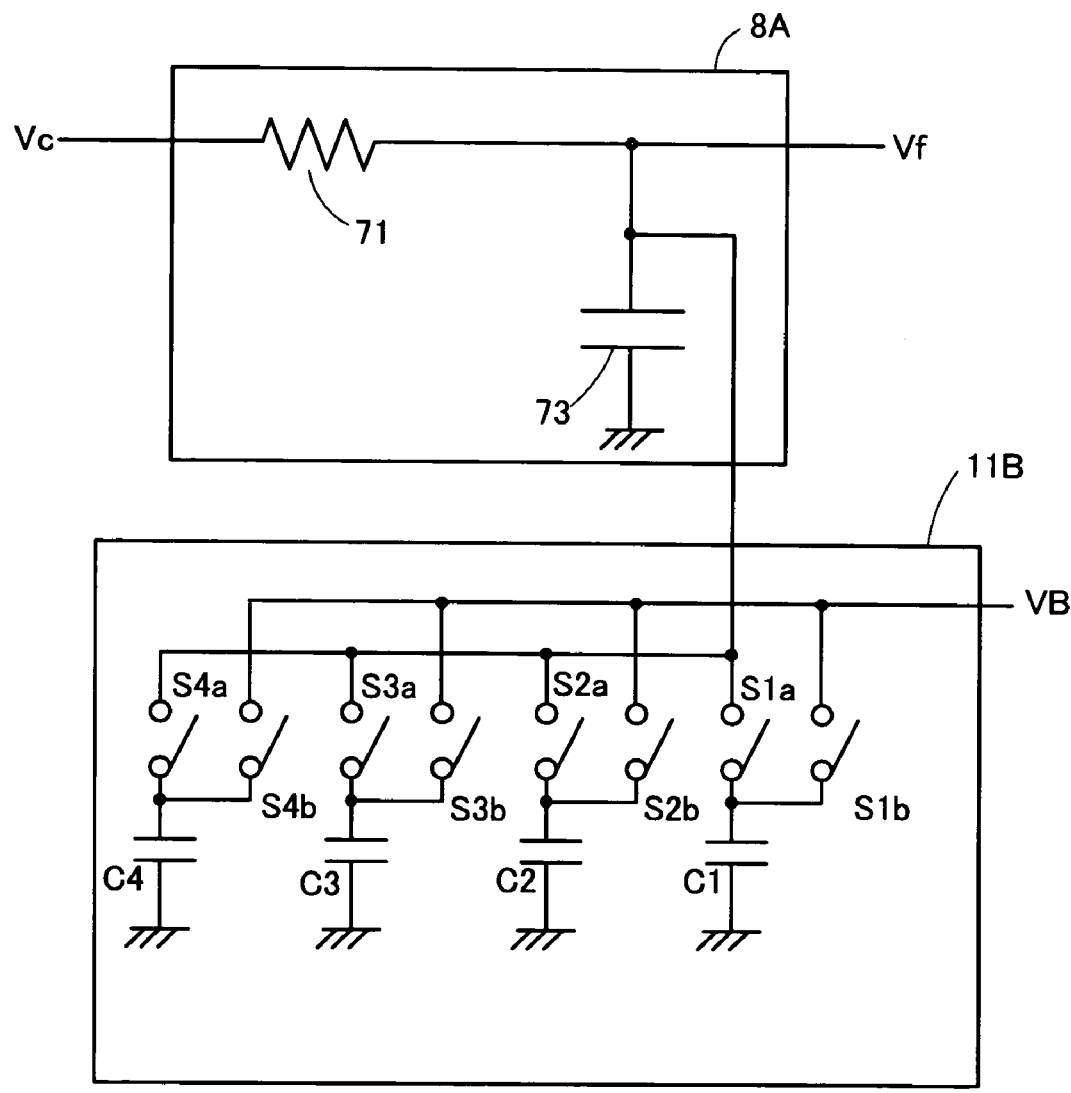
FIG. 3 shows a modulator circuit 11B directed to the first embodiment.

FIGS. 2, 3 show modulator circuits 11A, 11B of the first embodiment and at the same time, the circuit structure of a loop filter (LPF) 8A and the relation of connection between the both circuits. The loop filter (LPF) 8A is an example of the structure of a low pass filter in which an output signal Vc outputted from the charge pump circuit 7 is inputted to a resistor device 71 and smoothed by a capacitance device 73. The inputted output signal Vc is smoothed and outputted as the phase balanced voltage Vf.

In the modulator circuits 11A, 11B, plural capacitance devices C1–C4 each in which a terminal thereof is connected to 0V are provided in parallel. The other terminal of each of the capacitance devices C1–C4 is connected to a terminal of a capacitance device 73 within the loop filter (LPF) 8A through respective switch devices S1a–S4a and at the same time, connected to a predetermined voltage 0V (FIG. 2) or VB (FIG. 3) both of which are a charge/recharge voltage of the capacitance devices C1–C4 through respective switch devices S1b–S4b.

If charge/discharge route which charges/discharges the capacitance devices C1–C4 with a predetermined voltage and charge distribution route in which charge distribution is carried out between the capacitance devices C1–C4 and the capacitance device 73 are established by controlling conductivity of the switches S1a–S4a and S1b–S4b provided on each of the capacitance devices C1–C4.

Here, a case where the loop filter (LPF) 8A, the modulator circuits 11A, 11B or a clock generator containing these circuits is constructed using a semiconductor integrated circuit device manufactured based on semiconductor technology is considered. In the semiconductor integrated circuit device, the capacitance device 73 and capacitance devices C1–C4 can be disposed adjacent each other. Configuring the respective capacitance devices by connecting the same capacitance units in parallel is carried out on design of the semiconductor integrated circuit device. Consequently, the physical structure and electrical environment of the capacitance unit, the capacitance device and the surrounding environment can be made consistent accurately between individual capacitance units or individual capacitance devices. As a result, the relative accuracy of the capacitance value can be made highly consistent among the capacitance devices 73, C1–C4, so that the phase balanced voltage Vf can be modulated at a high precision.

Figure 4:
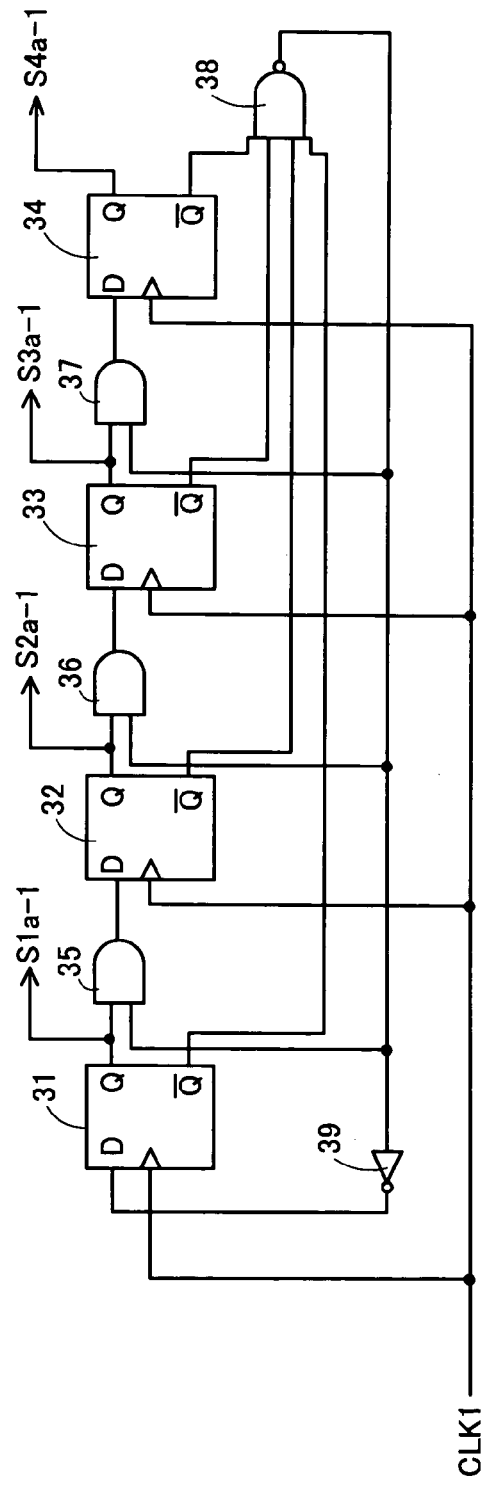
FIG. 4 is a circuit diagram showing a modulation control circuit for controlling modulator circuits 11A and 11B.
Figure 5:
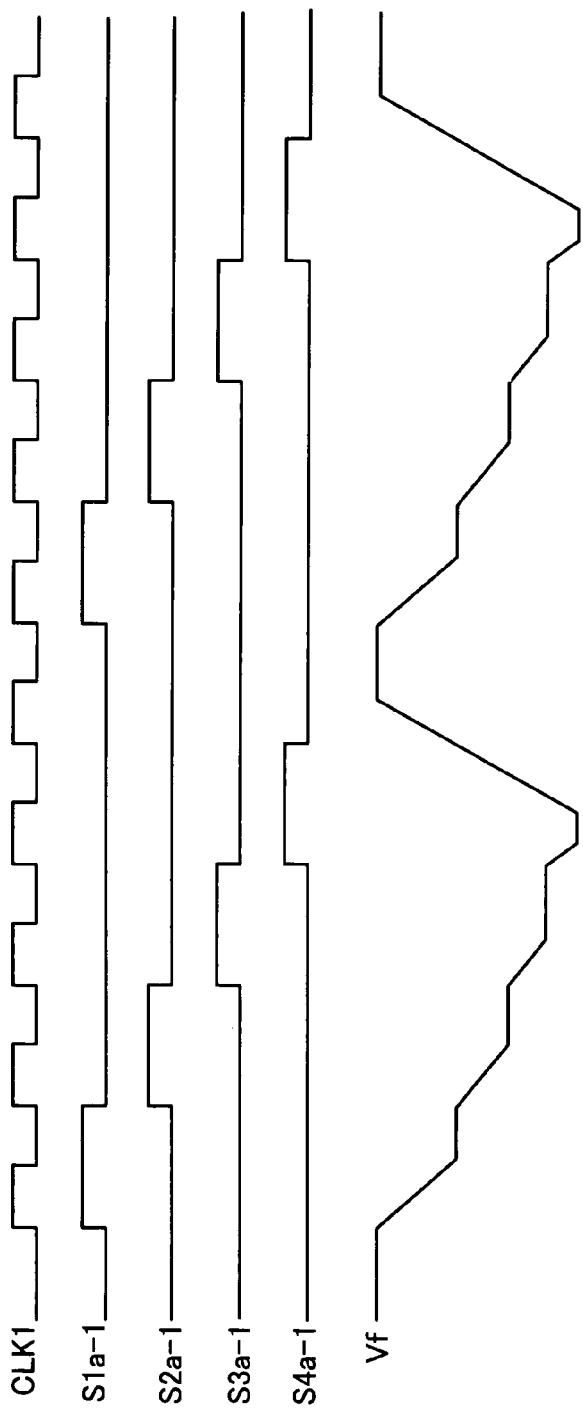
FIG. 5 is a timing chart for showing modulation operation by the modulation control circuit of FIG. 4.

FIG. 4 shows an example of the structure of a modulation control circuit for controlling the modulation circuits 11A, 11B (FIGS. 2, 3). FIG. 5 is a timing chart thereof.

The control circuit in FIG. 4 outputs control signals S1a-1 1 to S4a-1 for controlling conductivity of the switches S1a–S4a successively at each period of clock signal CLK1. The control signals S1a-1 to S4a-1 are outputted from output terminals Q of D flip flops (hereinafter referred to as DFF) 31–34 which are triggered by the clock signal CLK1. The output terminal Q of each of the preceding DFFs 31–33 and the output terminals of AND gates 35–37 in which the output terminal of NAND gate 38 to which the output terminal /Q of each DFF is connected and the output terminal Q of each of the preceding DFF 31–33 are inputted are connected to the input terminal D of each of the DFFs 32–34. The output terminal of the NAND gate 38 is inverted by an inverter gate 39 and connected to the input terminal D of the DFF 31. The DFFs 31–34 are connected successively so that a counter structure for feedback to the DFF 31 is constructed.

The control signals for controlling the switch devices S1b–S4b (not shown) can be supplied as a negative phase signal of the control signals S1a-1 to S4a-1. Charge/discharge with a predetermined voltage can be achieved in a period in which the capacitance device 73 is not connected.

The operation of the circuit will be described with reference to the timing chart shown in FIG. 5. The state in which the phase balanced voltage Vf is placed on the voltage value of the lock frequency is regarded as the initial state. It is assumed that a low level signal is outputted from the output terminal Q of each of all the DFFs 31–34 while a high level signal is outputted from the output terminal /Q. If the clock signal CLK1 is changed from this state to a high level, the control signal S1a-1 is changed to high level corresponding to the high level signal inputted to the input terminal D of the DFF 31 and then, the high level is maintained in the period of a single cycle. Because a low level signal is outputted from the output terminal /Q at the same time, the output signal of the NAND gate 38 turns to high level and the output signal of the AND gate 35 is maintained at high level. Upon rise of a next clock cycle, the control signal S2a-1 of the DFF 32 in which the high level signal is inputted is changed to the high level and the control signal S1a-1 of the DFF 31 in which the low level signal is inputted through the inverter gate 39 is changed to the low level. At each clock cycle of the clock signal CLK1, the control signals S3a-1, S4a-1 are maintained at the high level successively during a single clock cycle and then returned to the low level. After that, the high level of the control signal S1a-1 is gained again and this cycle is repeated.

If it is so constructed that the switch devices S1a–S4a are turned ON when the control signals S1a-1 to S4a-1 are of high level, the capacitance devices C1–C4 are connected to the capacitance device 73 successively at each clock cycle, so that electric charges at the predetermined voltage, which are applied or released in the preceding stage, are distributed. If the predetermined voltage is set to be a lower voltage than the phase balanced voltage Vf, the distribution of electric charges with the capacitance device 73 is carried out each time when the capacitance devices C1–C4 are connected as shown in FIG. 5 and the voltage level of the phase balanced voltage Vf, which is a terminal voltage of the capacitance device 73, is shifted to the side of a low voltage. Then, if the capacitance device C4 is connected due to transition of the control signal S4a-1 to the high level, the voltage level of the phase balanced voltage Vf drops, so that when the dead band region of the PLL circuit is surpassed, the lock operation of the PLL circuit is carried out and the phase balanced voltage Vf is returned to a voltage value under which the lock frequency is outputted. Hereinafter, this operation is repeated.

The phase balanced voltage Vf is shifted to the side of the low voltage successively, so that a modulation waveform in which it returns to the lock voltage at a predetermined timing is obtained. The voltage control oscillator (VCO) 9 in which an oscillation frequency having a positive correlation with an inputted voltage value is determined is capable of acquiring an output clock signal fo whose frequency changes cyclically to the side of the low frequency with respect to the oscillation frequency of a reference clock signal fr.

Here, the clock signal CLK is a reference clock signal fr or an oscillation signal obtained by dividing the reference clock signal fr at a predetermined dividing ratio.

FIG. 5 shows the waveform in case where the predetermined voltage is 0V (FIG. 2) or the VB is a lower voltage than the value of the phase balanced voltage Vf when it is locked by the PLL circuit. However, the first embodiment is not restricted to this example. For example, if as the predetermined voltage VB, a higher voltage level than the phase balanced voltage Vf is set up, a waveform modulated in an opposite direction to FIG. 5 can be obtained as the modulation waveform of the phase balanced voltage Vf. The voltage control oscillator (VCO) 9, in which an oscillation frequency having a positive correlation with the inputted voltage value is determined, is capable of obtaining the output clock signal fo whose frequency changes cyclically to the side of a high frequency with respect to the oscillation frequency of the reference clock signal fr.

Although FIGS. 4, 5 show a case where the capacitance devices C1–C4 are connected to the capacitance device 73 successively at each cycle of the clock signal CLK1, connection timing and connection time of the embodiment are not restricted to this example. It is permissible to change the connection timing and connection time for each of the capacitance devices C1–C4. Consequently, the modulation waveform of the phase balanced voltage Vf can be set freely.

Figure 6:
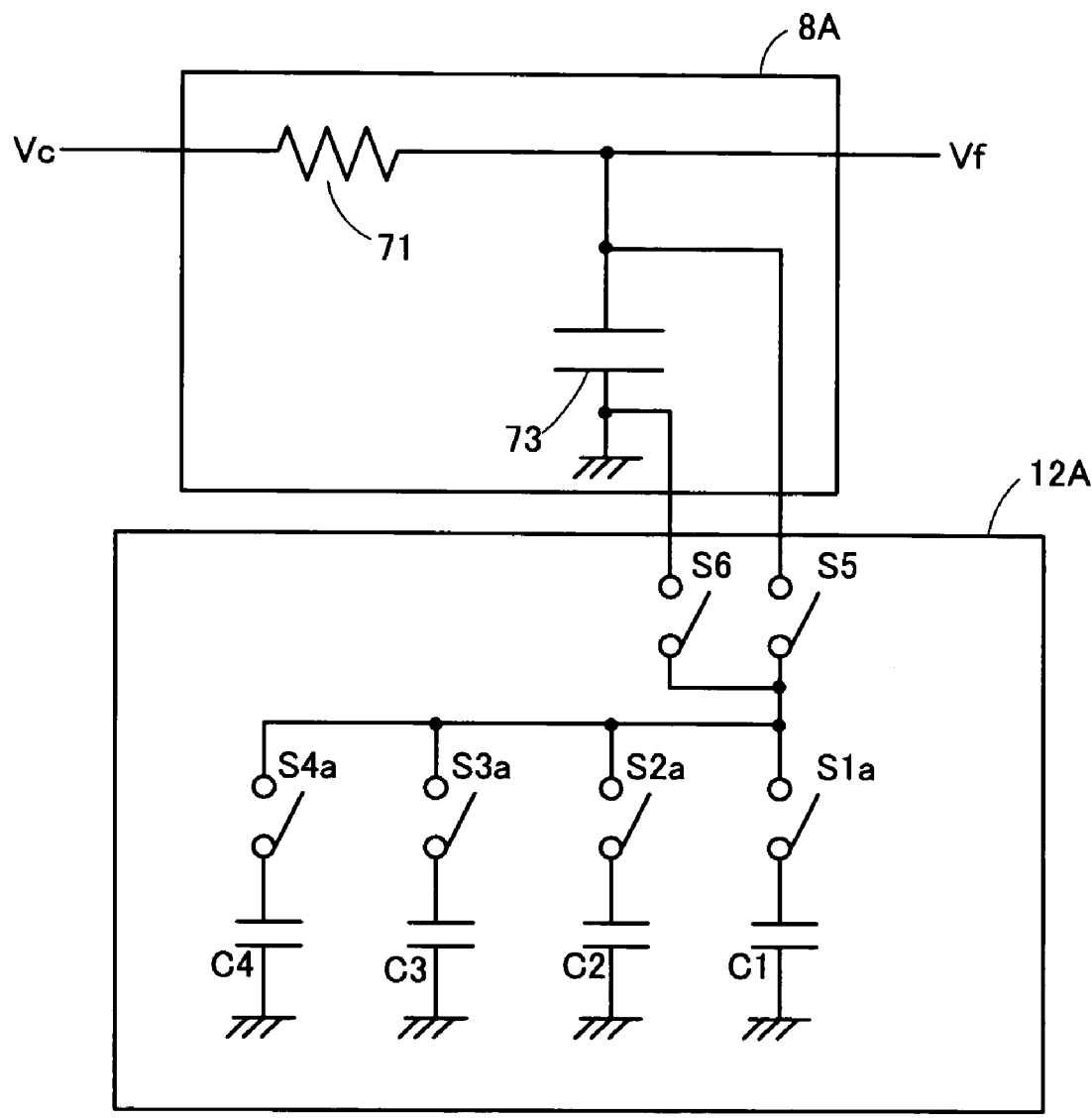
FIG. 6 is a circuit diagram showing a modulator circuit 12A directed to a second embodiment.
Figure 7:
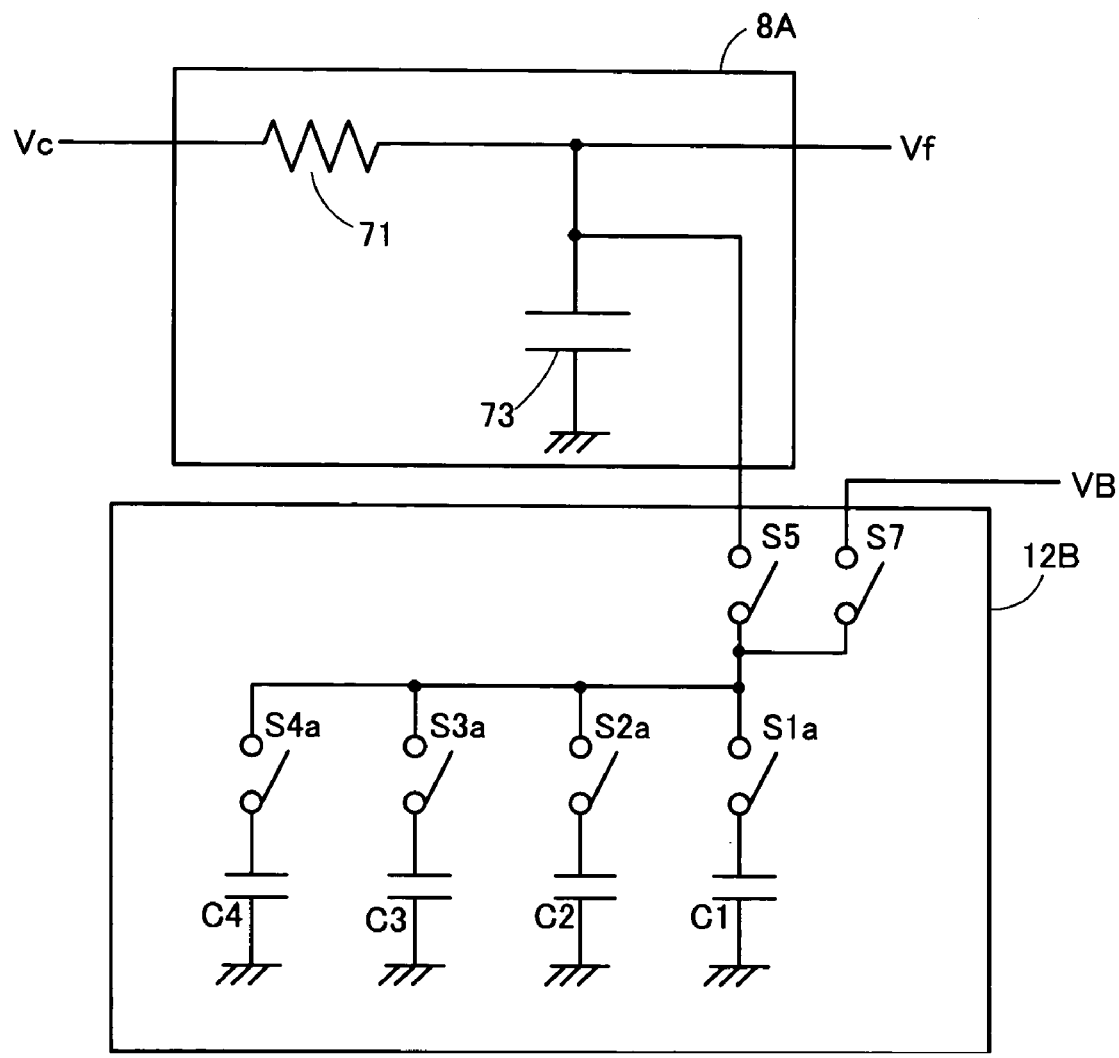
FIG. 7 is a circuit diagram showing a modulator circuit 12B directed to the second embodiment.

Next, FIGS. 6, 7 show the modulator circuit 12A, 12B of the second embodiment. The modulator circuits 12A, 12B are provided with select switch device S5, S6 (FIG. 6) and S5, S7 (FIG. 7) for selecting any one of the capacitance device 73 and predetermined voltage instead of the switch devices S1b–S4b in the modulator circuits 11A, 11B of the first embodiment. In FIG. 6, 0V is selected through the switch device S6 as the predetermined voltage and in FIG. 7, VB is selected through the switch device S7 as the predetermined voltage.

Charge/discharge route which charges/discharges the capacitance devices C1–C4 with the predetermined voltage and charge distribution route in which charge distribution is carried out between the capacitance devices C1–C4 and the capacitance device 73 are established by controlling the switch devices S1a–S4a provided on each of the capacitance devices C1–C4 and the select switch devices S5, S6 and S5, S7. If the select switch device S5 is selected, each of the capacitance devices C1–C4 can control connection to the capacitance device 73 individually. If the select switch device S6 or S7 is selected, each of the capacitance devices C1–C4 can be charged with/discharged of the predetermined voltage 0V or VB.

Figure 8:
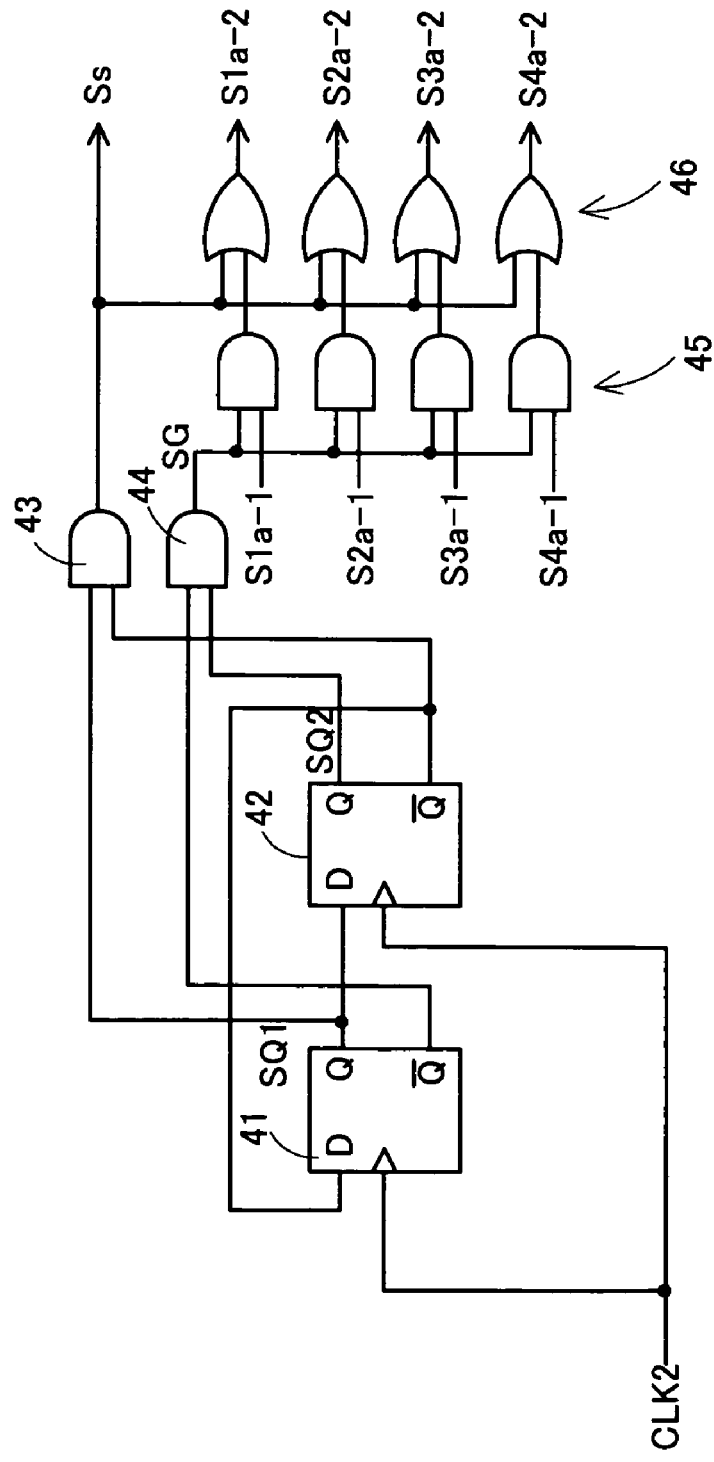
FIG. 8 is a circuit diagram showing a modulation control circuit for controlling modulator circuits 12A and 12B.

The control circuit of FIG. 8 is a circuit which outputs control signals Ss, SG alternately in order to establish the charge/discharge route and charge distribution route alternately. Because charging/discharging of the capacitance devices C1–C4 are carried out at the same time, the charge/discharge route is formed by turning ON the select switch devices S6, S7 and switch devices S1a–S4a. Because distribution of charges to the capacitance device 73 is executed for each of the capacitance devices C1–C4, the charge distribution route is formed by turning ON the select switch device S5 and any one of the switch devices S1a–S4a at the same time. Here, the select switch devices S6, S7 are turned ON corresponding to high-level control signal Ss and the select switch device S5 is turned ON corresponding to low-level control signal Ss.

The output terminal Q of the DFF 41 is connected to an AND gate 43 and the input terminal D of a DFF 42 and the output terminal /Q is connected to an AND gate 44. The output terminal Q of the DFF 42 is connected to the AND gate 44 and the output terminal /Q is connected to the AND gate 43 and the input terminal D of the DFF 41. The DFFs 41, 42 are triggered by clock signal CLK2. Johnson counter is constructed with the DFFs 41, 42. Control signals Ss, SG are outputted from the output terminal of the AND gate 43, 44. The control signal SG is inputted to an AND gate group 45 provided on each of the control signals S1a-1 to S4a-1 shown in FIG. 4 so as to gate-control the control signals S1a-1 to S4a-1. The control signal Ss is inputted to an OR gate group 46 provided on each output terminal of the AND gate group 45. Control signals S1a-2 to S4a-2 are outputted from the OR gate group 46.

Figure 9:
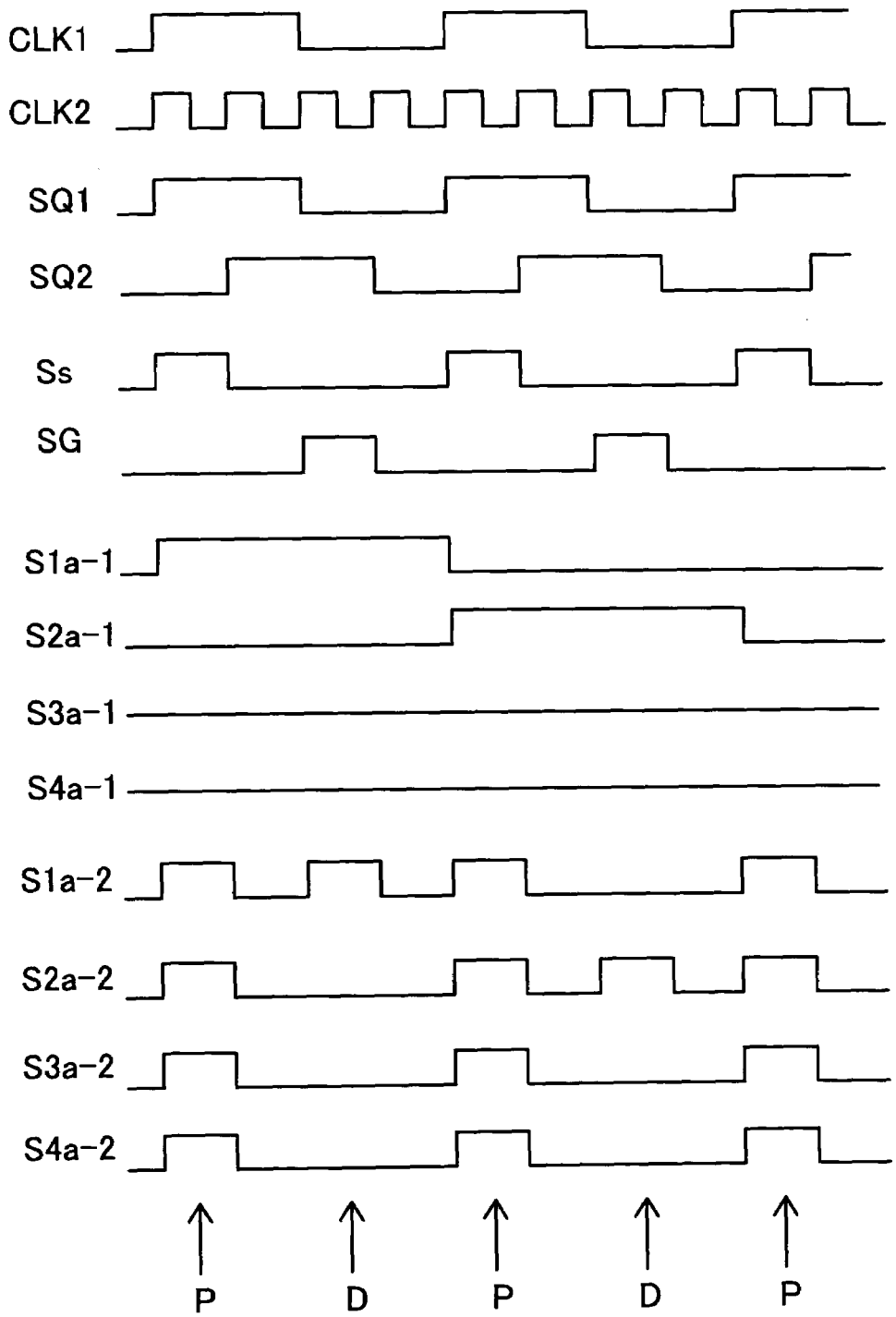
FIG. 9 is a timing chart for showing modulation operation by the modulation control circuit of FIG. 8.

As evident from the timing chart shown in FIG. 9, the Johnson counter which is constituted of the DFFs 41, 42 is operated at each oscillation period of the clock signal CLK2, so that signals SQ1, SQ2 are outputted from the output terminal Q at the cycle obtained by dividing a frequency by 2. The control signal Ss outputted as a product of reversed signals of the signal SQ1 and signal SQ2 is outputted as a high level signal which arises over a cycle of every four cycles of the clock signal CLK2. The control signal SG outputted as a product of the reserved signal of the signal SQ1 and the signal SQ2 is outputted as a high level signal which arises over a cycle in the middle of the control signal Ss at every four cycles of the clock signal CLK2.

The high-level control signal Ss is outputted as high-level control signal S1a-2 to S4a-2 through an OR gate group 46. The high-level control signal SG outputs signals having the same phase as the control signals S1a-1 to S4a-1 and further is outputted as the control signal S1a-2 to S4a-2 through the OR gate group 46.

The control signals S1a-1 to S4a-1 are outputted from the circuit shown in, for example, FIG. 4. If it is assumed that the clock signal CLK2 is gained by dividing the clock signal CLK1 by 4, it comes that the control signals S1a-2 to S4a-2 are outputted successively at every four cycles of the clock signal CLK2. As a result of gating the control signal GS with the AND gate group 45, the control signals S1a-2 to S4a-2 which arise over a single cycle are outputted successively every four cycles.

Because the control signal Ss turns ON the select switch devices S6, S7 in FIG. 9, the cycle in which the control signals S1a-2 to S4a-2 are outputted at the same time is charge/discharge period P in which the capacitance devices C1–C4 are charged with/discharge of the predetermined voltage. The period sandwiched by the charge/discharge periods P is charge distribution period D. The control signals S1a-2 to S4a-2 are outputted successively, so that the capacitance devices C1–C4 are connected to the capacitance device 73 successively.

If it is so constructed that the switch devices S1a–S4a are turned ON in a period in which the control signals S1a-2 to S4a-2 are of high level like the first embodiment, the capacitance devices C1–C4 are connected to the capacitance device 73 every four cycles of the clock signal CLK2 and the capacitance devices C1–C4 are charged with/discharged of the predetermined voltage in a cycle in the middle thereof. If the predetermined voltage is set to be a lower voltage than the phase balanced voltage Vf, the phase balanced voltage Vf is shifted to the side of a lower voltage like FIG. 5, so that a modulation waveform in which it returns to the lock voltage at a predetermined timing is obtained. In case of the voltage control oscillator (VCO) 9 in which an oscillation frequency having a positive correlation with an inputted voltage value is determined, the output clock signal fo whose frequency changes cyclically to the side of the low frequency with respect to the oscillation frequency of the reference clock signal fr can be obtained.

Here, the clock signal CLK2 is a reference clock signal fr or an oscillation signal obtained by dividing the reference clock signal fr at a predetermined diving ratio.

Like the first embodiment, if the predetermined voltage VB is set to a higher voltage level than the phase balanced voltage Vf, a waveform modulated to an opposite direction to FIG. 5 can be obtained as the modulation waveform of the phase balanced voltage Vf.

In FIGS. 8, 9, a case where the capacitance devices C1–C4 are connected to the capacitance device 73 successively has been described. Needless to say, the plural capacitance devices C1–C4 can be connected thereto at the same time. Additionally, the connection timing and connection time can be changed like the first embodiment. Consequently, the modulation waveform of the phase balanced voltage Vf can be set freely.

Needless to say, the control shown in FIGS. 8, 9 can be applied to the modulator circuits 11A, 11B of the first embodiment.

Figure 10:
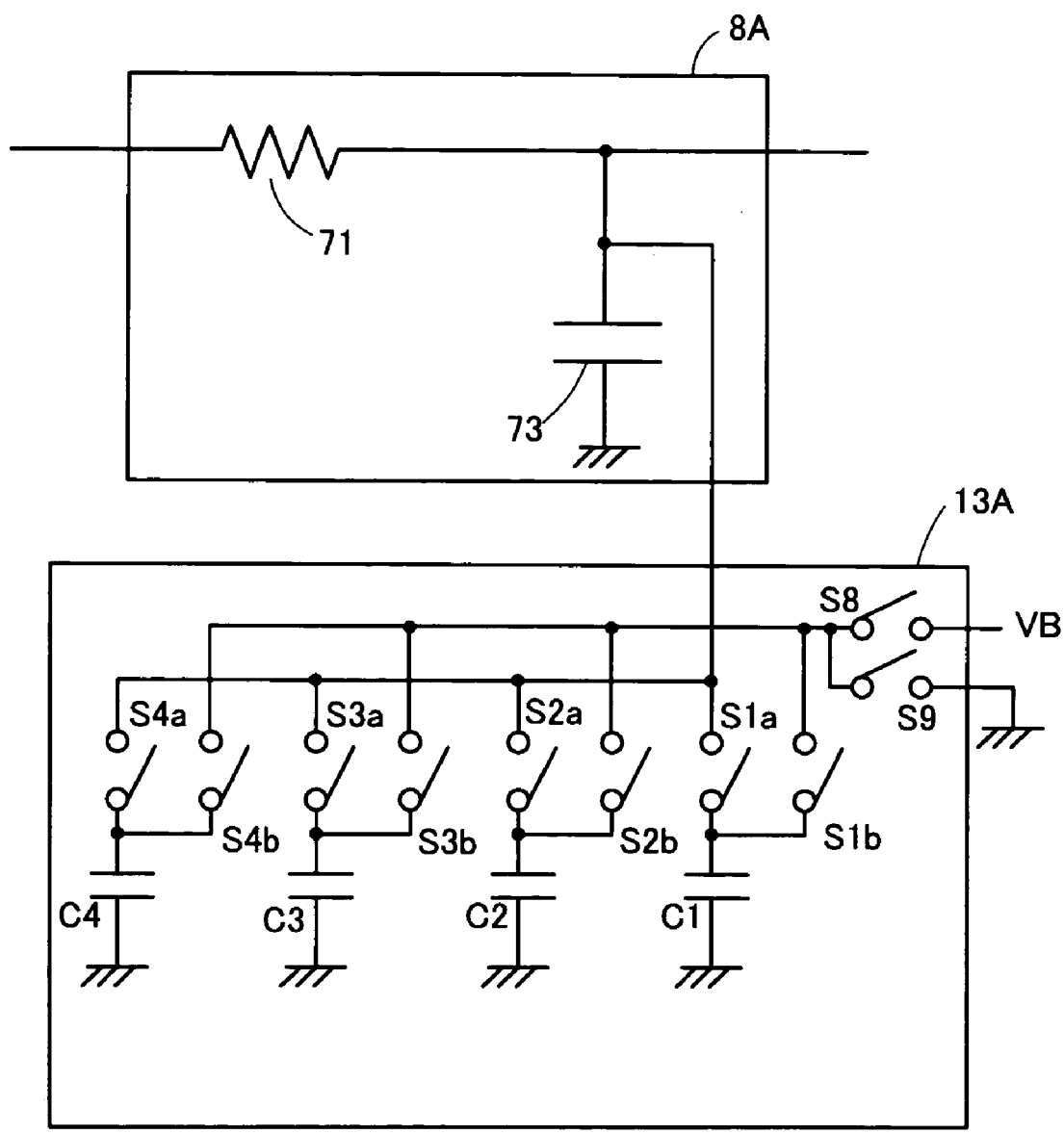
FIG. 10 shows a modulator circuit 13A directed to a third embodiment.
Figure 11:
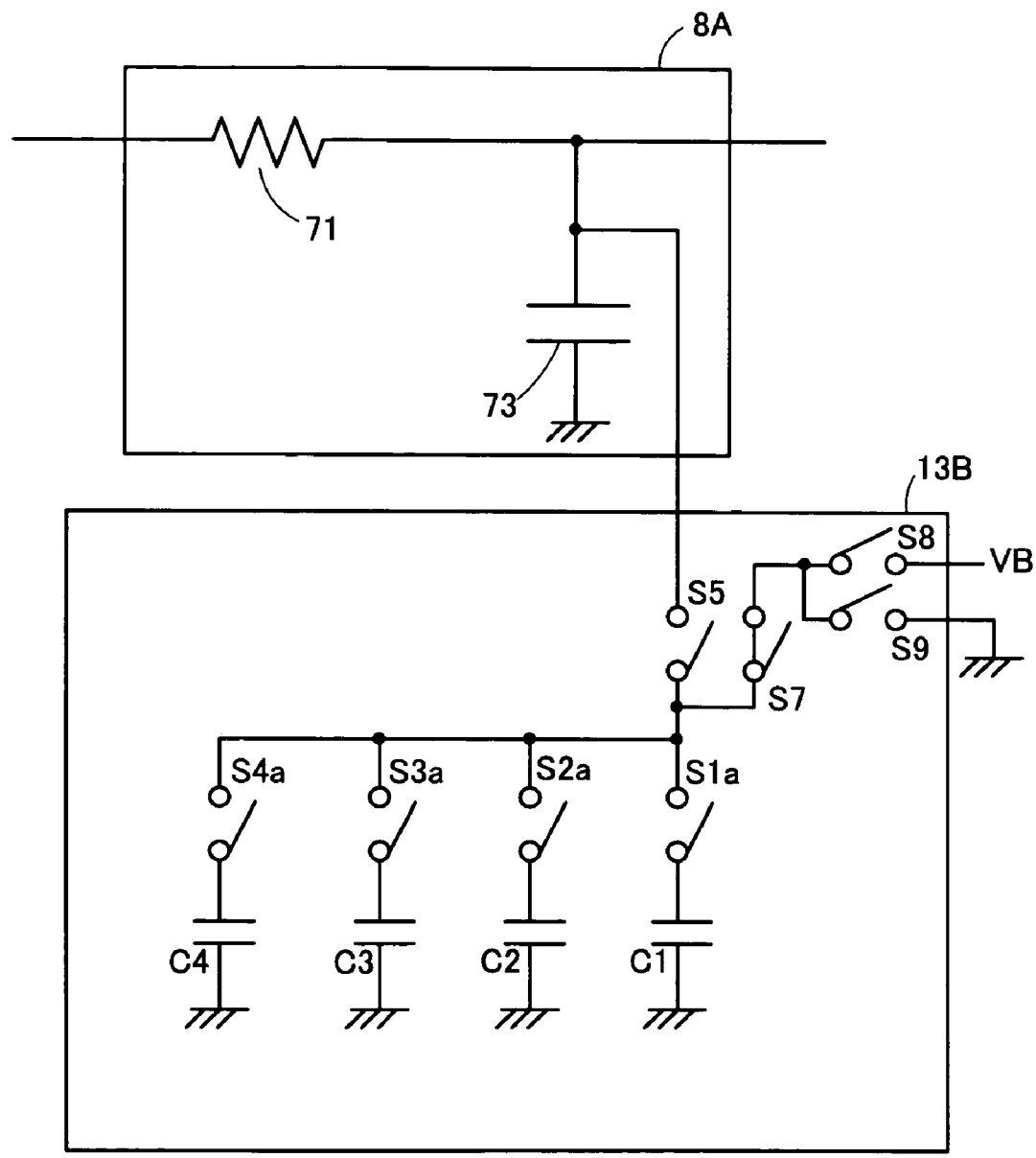
FIG. 11 shows a modulator circuit 13B directed to the third embodiment.

The third embodiment shown in FIGS. 10, 11 includes select switch devices S8, S9 which change the predetermined voltage value as well as the modulator circuit 11B (FIG. 3) of the first embodiment and the modulator circuit 12B (FIG. 7) of the second embodiment. By turning ON the select switch device S8, the predetermined voltage VB can be selected and by turning ON the select switch device S9, the predetermined voltage 0V can be selected.

In case of FIG. 10, turning ON/OFF the select switch devices S8, S9 can be carried out ahead of the modulation or during the modulation operation. The turning ON/OFF of the select switch devices S8, S9 can be executed in a condition that the switch devices S1b–S4b are not turned ON. If a sufficient time is secured until the capacitance devices C1–C4 are connected to the capacitance device 73 and a time in which the capacitance devices C1–C4 are charged or discharged sufficiently is secured after the select switch devices S8, S9 are changed, the select switch devices S8, S9 can be changed in a condition that the switch devices S1b–S4b are turned ON.

In FIG. 11, this change is preferred to be carried out before the select switch device S7 is turned ON. If the charging/discharging is completed by the turned predetermined voltage sufficiently until the select switch device S7 is turned OFF after it is turned ON, the select switch devices S8, S9 can be changed in a period in which the select switch device S7 is turned ON.

Figure 12:
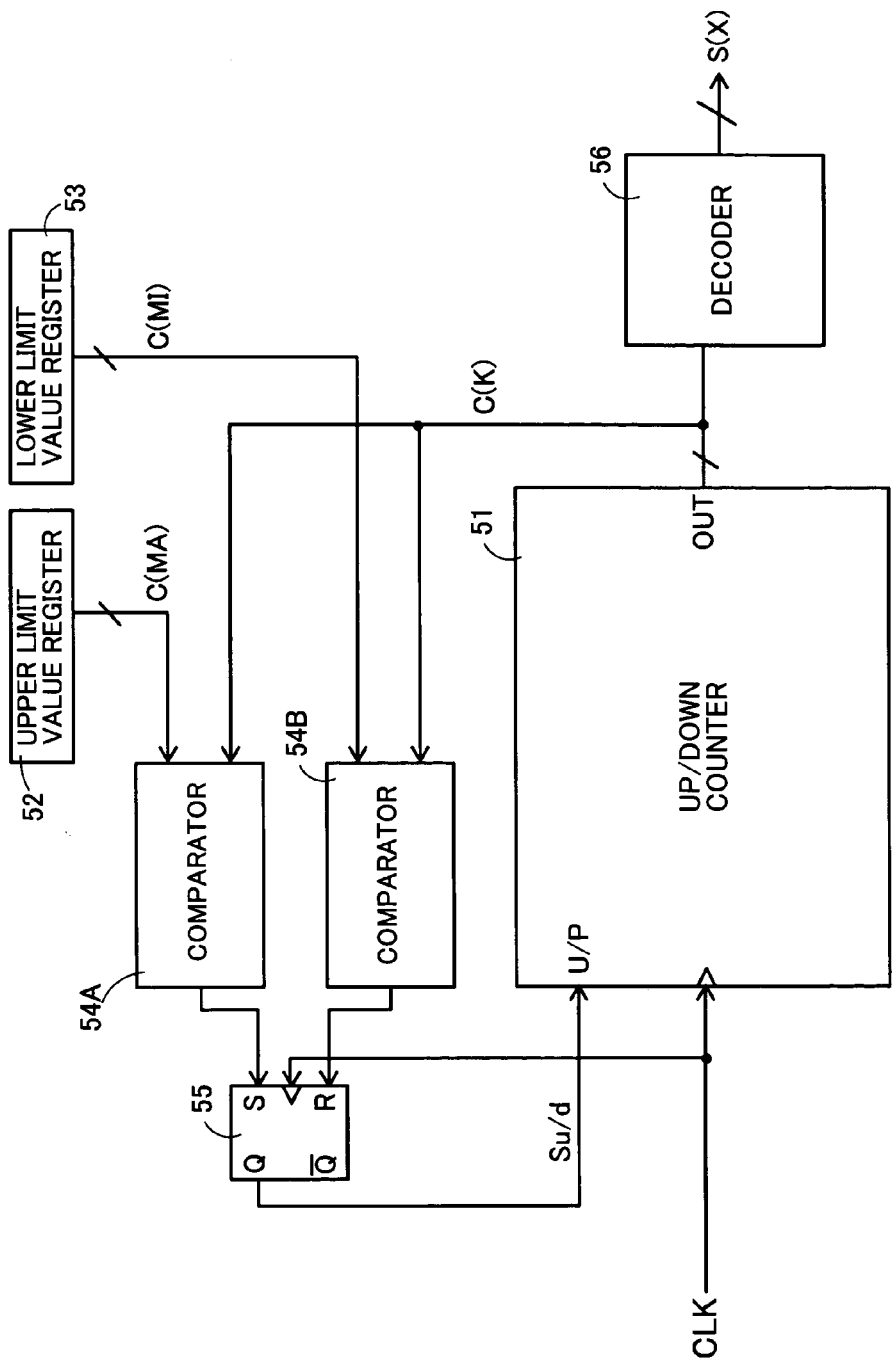
FIG. 12 is a circuit diagram showing a modulation control circuit directed to fourth embodiment in which an up/down counter is used.
Figure 13:
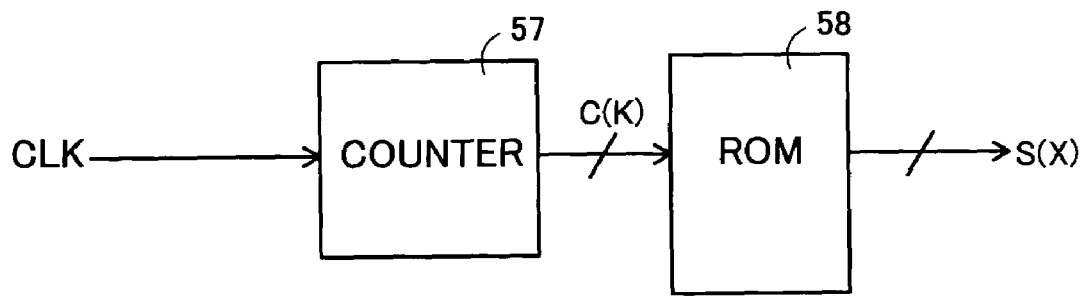
FIG. 13 is a circuit diagram showing a modulation control circuit directed to fourth embodiment in which ROM is used.

The fourth embodiment shown in FIGS. 12, 13 shows other example of the circuit structure of the modulation control circuit. FIG. 12 shows an example of the structure in case where an up/down counter is used and FIG. 13 shows a case where a ROM is used.

In the control circuit shown in FIG. 12, a count value C(K) outputted from the up/down counter 51 is inputted to a decoder 56 and decoded therein and then, that decoded signal is outputted as the control signal S(X) which controls the switch devices S1a–S4a, S1b–S4b, select switch devices S5–S9.

The count value C(K) is inputted to the comparators 54A, 54B and compared with upper limit count value C(MA) and lower limit count value C(MI), which are stored in an upper limit value register 52 and a lower limit value register 53 respectively. Comparison output signals from the comparators 54A, 54B are inputted to a set input terminal and a reset input terminal of a flip flop 55. The flip flop 55 is set if the count value (C) coincides with the upper limit count value C(MA) and is reset if it coincides with the lower limit count value C(MI). The output terminal Q of the flip flop 55 is connected to a count direction setting terminal U/P of the up/down counter 51. If the flip flop 55 is set so that a high-level instruction signal Su/d is outputted from the output terminal Q, the up/down counter 51 starts count-down operation. If the flip flop 55 is reset so that a low-level instruction signal Su/d is outputted from the output terminal Q, the up/down counter 51 starts count-up operation.

The up/down counter 51 repeats the count-down operation and count-up operation between the upper limit count value C(MA) and the lower limit count value C (MI) based on the clock signal CLK. Because a predetermined control signal S(X) is outputted to the predetermined count value C(K) by the decoder 56, the connection between the capacitance 73 and the capacitance devices C1–C4 is controlled by repeating a predetermined order and an opposite order which is opposite to the predetermined order.

The select switch devices S8, S9 (FIGS. 10, 11) can be changed based on the instruction signal Su/d at this time. If the predetermined voltage VB is set on a higher voltage level than the phase balanced voltage Vf, the predetermined voltage 0V, which is a lower voltage than the phase balanced voltage Vf and the predetermined voltage VB, which is a higher voltage are selected alternately corresponding to a change of the count direction. Consequently, the output clock signal fo, which changes cyclically with positive and negative voltage levels to the phase balanced voltage Vf corresponding to the lock frequency can be obtained.

In the control circuit of FIG. 13, the count value C(K) outputted from the counter 57 corresponding to the clock signal CLK is inputted to a ROM 58 and then, a control signal S(X) for controlling the switch devices S1a–S4a, S1b–S4b and the select switch devices S5–S9 is read out with the count value C(K) as a reference address. Plural control signals S(X) are read out to a single count value C(K). The ROM 58 needs to include only a structure for reading out plural data to an address, like multiple bit input/output configuration or burst operating configuration.

If the control signals S(X) to be stored in the ROM 58 are stored successively according to an address given as the count value C(X), the connecting order of the capacitance devices C1–C4, the quantity of devices to be connected at the same time, or/and the changing order of the predetermined voltage, timing, charging/discharging of the capacitance devices C1–C4, connection timing to the capacitance device 73, modulation circuit state and the connection status to the loop filter (LPF) 8 can be set up freely.

Further, if a rewritable memory device like a flash memory or RAM is used instead of the ROM 58, the modulation waveform can be changed as required.

In FIGS. 12, 13, the clock signal CLK is a reference clock signal fr or an oscillation signal obtained by dividing the reference clock signal fr at a predetermined dividing ratio.

The modulation control circuit shown in FIGS. 12, 13 can be applied to the modulator circuit of the first–third embodiments.

The fifth embodiment shown in FIG. 14 has a booster circuit 5 for raising the phase balanced voltage Vf. The raised output voltage is supplied to the modulator circuit 1 as the predetermined voltage Vref. The predetermined voltage Vref of a higher voltage level than the phase balanced voltage Vf corresponding to the lock frequency can be set. The phase balanced voltage Vf corresponding to the lock frequency can be modulated to the side of high voltage. Consequently, the output clock signal fo which changes to the side of the high frequency or the low frequency with respect to the lock frequency can be obtained.

As described above according to the clock generator of this embodiments, the capacitance devices C1–C4, which are a second capacitance section of the modulator circuit 1 are connected to the capacitance device 73, which is a first capacitance section of the loop filter 8 so as to change the capacitance value and then, the phase balanced voltage Vf is modulated within the dead band region in which no difference signals Pr, Pp is outputted from the charge pump circuit 7. Consequently, the oscillation frequency of the output clock signal fo including the oscillation frequency of the reference clock signal fr can be changed. Further, because the phase balanced voltage Vf can be modulated by changing the capacitance value stored after charging/discharging of electric charges is completed without input/output of new electric charges to the loop filter 8, increase of current consumption can be suppressed when the phase balanced voltage Vf is modulated.

Because in the modulator circuit 1, each of the capacitance devices C1–C4 is provided with charge/discharge route and charge distribution route, each of the capacitance devices C1–C4 can be charged with/discharge of the predetermined voltage (0V, VB) and each of the capacitance devices C1–C4 can be connected to the capacitance device 73. The value of the predetermined voltage which charges/discharges the capacitance devices C1–C4 can be set independently for each capacitance device and the type and quantity of the capacitance devices C1–C4 to be connected to the capacitance device 73 can be set up freely. Additionally, the modulation width of the phase balanced voltage Vf can be set freely.

Further because the select switch devices S5, S6 and S5, S7 are provided as the first select switch section, the switch devices S1a–S4a, which are a third switch section, can be used for both the charge/discharge route and charge distribution route, thereby simplifying the circuit structure.

Further because the select switch devices S8, S9, which are a second select section, are provided, plural predetermined voltage can be set up.

Additionally, because the booster circuit which raises the phase balanced voltage Vf and supplies it as the predetermined voltage Vref is provided, the capacitance devices C1–C4 can be charged with a higher voltage than the phase balanced voltage Vf as the predetermined voltage Vref, so that the phase balanced voltage Vf can be modulated to the side of a high voltage.

The modulation control circuit 3 which controls the modulator circuit 1 includes a counter section having the DFFs 31–34 which execute count operation according to the clock signal CLK1 based on the reference clock signal fr as shown in FIG. 4. and the NAND gate 38 which is an initialize section for initializing the counter section corresponding to the predetermined count value outputted from the counter section. The phase balanced voltage Vf is modulated successively corresponding to the control signals S1a-1 to S4a-1 outputted corresponding to the count operation and the control signal is initialized cyclically. The phase balanced voltage Vf can be formed into a modulation waveform in which a change in voltage is repeated cyclically. Consequently, the output clock signal fo whose oscillation frequency changes cyclically can be obtained.

In the modulation control circuit 3 for controlling the modulator circuit 1, as shown in FIG. 12, the up/down counter 51 executes the count operation in a specified count direction corresponding to the clock signal CLK based on the reference clock signal fr. The instruction signal Su/d which instructs changing of the count direction corresponding to upper limit/lower limit count value C(MA)/C(MI) which is a predetermined count value outputted from the up/down counter 51 is outputted from a switch instructor section around the flip flop 55. Consequently, as the phase balanced voltage Vf a modulation waveform whose cycle is based on a count value which increases/decreases between the upper limit and lower limit count values C(MA) and C(MI) can be obtained.

The predetermined voltage (0V, VB) is switched depending on the instruction signal Su/d. Consequently, a waveform which changes in both directions to high voltage and low voltage with respect to the phase balanced voltage Vf can be obtained as the modulation waveform.

In the modulation control circuit 3 for controlling the modulator circuit 1, the order of the control signals S(X) which configures the modulation waveform of the phase balanced voltage Vf can be stored in the ROM 58 which is a waveform storage section as shown in FIG. 13 and the control signal S(X) can be read out from the ROM 58 according to the clock signal CLK with the count value C(K) counted by the counter 57 as an address. Further, the modulation waveform of the phase balanced voltage Vf can be stored in the ROM 58 and the modulation waveform can be set freely.

If the loop filter 8A, the modulator circuits 11A–13A, 11B–13B and the clock generator are configured with the semiconductor integrated circuit device, the relative accuracy in capacitance value among the capacitance devices can be adjusted at a high precision, so that the phase balanced voltage Vf can be modulated at a high precision.

Needless to say, the present invention is not restricted to the above-described embodiments but may be improved or modified within a range not departing from the gist of the present invention.

Although in the embodiments, an example that four capacitance devices C1–C4 are connected in parallel as the modulator circuit has been described, the present invention is not restricted to this example, but it may be configured with three or less capacitance devices or five or more capacitance devices.

Further, although an example that any one of the capacitance devices C1–C4 is connected to the capacitance device 73 has been described, the present invention is not restricted to this example, but a structure that plural capacitance devices are connected to the capacitance device 73 at the same time can be adopted.

Although the capacitance value of the capacitance devices C1–C4 has not been described in this specification, the individual capacitance value may be set equal or to different capacitance values. In case of a structure comprised of capacitance devices each having a different capacitance value, the capacitance value to be connected to the capacitance device 73 can be adjusted depending on the connected capacitance devices or in case of a structure comprised of capacitance devices having equal capacitance value, the capacitance value to be connected to the capacitance device 73 can be adjusted by adjusting the quantity of the capacitance devices to be connected at the same time. If the capacitance value is adjusted, the value of the phase balanced voltage, which is obtained as a result of distribution of charges executed with the capacitance device 73, can be adjusted.

As described, the present invention provides a clock generator of which modulation accuracy improvement can be achieved without accompanying increase of power consumption due to constant current when spectrum diffusion is applied to a clock signal.

What is claimed is:

1. A clock generator comprising:
    a charge pump for inputting/outputting charges depending on oscillation frequency difference of a reference clock signal and an output clock signal;
    a loop filter including a first capacitance section which charges/discharges charge inputted/outputted from the charge pump, the loop filter outputting smoothed phase balanced voltage;
    an oscillator section for outputting the output clock signal of which oscillation frequency depends on the phase balanced voltage; and
    a modulator circuit for modulating the phase balanced voltage within a dead band region of the charge pump by changing a capacitance value of the loop filter including the first capacitance section;
    the modulator circuit comprising:
        at least one second capacitance section;
        a charge/discharge route for being established when the second capacitance section is charged/discharged at predetermined voltage for being separated from the first capacitance section; and
        a charge distribution route for being established when the charge charged/distributed in the second capacitance section via the charge/discharge route is distributed with the first capacitance section.

2. The clock generator according to claim 1, further comprising a booster circuit, wherein the phase balanced voltage is boosted and supplied as the predetermined voltage.

3. The clock generator according to claim 1, wherein each second capacitance section includes a first switch section for controlling to switch between the second capacitance section and a predetermined voltage source, and a second switch section for controlling to switch between the second capacitance section and the first capacitance section.

4. The clock generator according to claim 1, further comprising a first select switch section for selecting either the fist first capacitance section or the predetermined voltage source, and a third switch section provided for each second capacitance section, the third switch section controlling to switch between the second capacitance section and the first select switch section.

5. The clock generator according to claim 1, further comprising a second select switch section for selecting one of voltage power sources of which voltage values are different, as predetermined voltage source for outputting the predetermined voltage.

6. The clock generator according to claim 1, wherein capacitance value(s) of the at least one second capacitance section(s) is/are different.

7. The clock generator according to claim 1, further comprising:
    a counter section for conducting count operation basing on the reference clock signal; and
    an initialize section for initializing the counter section depending on a predetermined count value outputted from the counter section,
    wherein the second capacitance section(s) constituting a charge/discharge route or/and charge distribution route is/are selected depending on a count value outputted from the counter section.

8. The clock generator according to claim 7, further comprising a divider for dividing the reference clock signal, wherein a clock signal divided by the divider is inputted to either the counter section or the up/down counter section.

9. The clock generator according to claim 1, further comprising:
    an up/down counter for conducting count operation in a count direction designated based on the reference clock signal; and
    a switch instructor section for instructing to switch count directions depending on a predetermined count value outputted from the up/down counter section,
    wherein the second capacitance section(s) constituting a charge/discharge route or/and charge distribution route is/are selected depending on a count value outputted from the up/down counter section.

10. The clock generator according to claim 9, wherein the predetermined voltage is switched in accordance with a switch instruction from the switch instructor section.

11. The clock generator according to claim 9, further comprising a divider for dividing the reference clock signal, wherein a clock signal divided by the divider is inputted to either the counter section or the up/down counter section.

12. The clock generator according to claim 1, further comprising:
    a waveform recorder section for storing select order of the second capacitance section(s) or/and the predetermined voltage forming modulation waveform of the phase balanced voltage; and
    a counter section for conducting count operation basing on the reference clock signal,
    wherein the second capacitance section(s) or/and the predetermined voltage constituting a route to a charge/discharge route or/and charge distribution route is/are selected from the waveform recorder section depending on a count value outputted from the counter section.

13. The clock generator according to claim 12, further comprising a divider for dividing the reference clock signal, wherein a clock signal divided by the divider is inputted to either the counter section or the up/down counter section.

14. A spectrum diffusion method for a clock signal, of which steps comprising:
    detecting oscillation frequency difference of an output clock referenced with a reference clock signal with taking a dead band region within predetermined frequency difference and inputting/outputting depending on detected oscillation frequency difference;
    outputting phase balanced voltage smoothed by charging/discharging inputted/outputted charges to a first capacitance section;
    outputting the output clock signal of which oscillation frequency depends on the phase balanced voltage; and
    modulating the phase balanced voltage so as to make the output clock signal modulate within the dead band region.

15. The spectrum diffusion method for a clock signal according to claim 14, wherein, at least one second capacitance section is provided, and when the phase balanced voltage is modulated, charging/discharging to the second capacitance section(s) with predetermined voltage and connecting the second capacitance section(s) to the first capacitance section are alternately conducted.

16. The spectrum diffusion method for a clock signal according to claim 14, wherein at least one second capacitance section charged/discharged to predetermined voltage is provided, and when the phase balanced voltage is modulated, the second capacitance section(s) is connected to the first capacitance section to distribute charges every predetermined time.

* * * * *